(12) United States Patent
Lim

(10) Patent No.: US 8,231,987 B2
(45) Date of Patent: Jul. 31, 2012

(54) MAGNETIC DOMAIN DATA STORAGE DEVICES AND METHODS OF MANUFACTURING THE SAME

(75) Inventor: Chee-kheng Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 12/000,243

(22) Filed: Dec. 11, 2007

(65) Prior Publication Data

US 2008/0160349 A1 Jul. 3, 2008

(30) Foreign Application Priority Data

Jan. 2, 2007 (KR) .................. 10-2007-0000309

(51) Int. Cl.
*G11B 5/66* (2006.01)
(52) U.S. Cl. ............. 428/827; 365/81; 365/85; 365/87; 365/171; 365/173
(58) Field of Classification Search .................. 365/171, 365/173, 158, 131, 66, 80, 83, 85; 257/421, 257/E21, 665; 438/3; 977/933, 934, 935; 428/827, 829, 839.1, 818, 819, 819.2
See application file for complete search history.

(56) References Cited

U.S. PATENT DOCUMENTS

| | | | |
|---|---|---|---|
| 3,685,029 A * | 8/1972 | Blanchard | ........... 365/173 |
| 3,982,234 A | 9/1976 | Voegeli | |
| 4,128,895 A | 12/1978 | Almasi et al. | |
| 7,141,317 B2 * | 11/2006 | Kikitsu et al. | ........... 428/829 |
| 2002/0048226 A1 | 4/2002 | Kawaguchi et al. | |
| 2004/0091748 A1* | 5/2004 | Kamata et al. | ........... 428/694 T |
| 2005/0019609 A1 | 1/2005 | Tang | |
| 2005/0078509 A1* | 4/2005 | Parkin | ........... 365/158 |
| 2006/0028863 A1 | 2/2006 | Chung et al. | |
| 2006/0177700 A1 | 8/2006 | Fullerton et al. | |

FOREIGN PATENT DOCUMENTS

| | | |
|---|---|---|
| JP | 5-250651 | 9/1993 |
| JP | 5-258274 | 10/1993 |
| JP | 2000-163814 | 6/2000 |
| JP | 2002-74636 | 3/2002 |
| JP | 2002-92843 | 3/2002 |
| JP | 2003-45015 | 2/2003 |
| JP | 2004-319762 | 11/2004 |
| JP | 2005-116022 | 4/2005 |
| JP | 2005-209303 | 8/2005 |

OTHER PUBLICATIONS

Sakuma, Akimasa "First Principle Calculation of the Magnetocrystalline Anisotropy Energy of FePt and CoPt Ordered Alloys." J. Phys. Soc. Jpn. 63. (1994). Abstract Only.*

(Continued)

*Primary Examiner* — Holly Rickman
*Assistant Examiner* — Lisa Chau
(74) *Attorney, Agent, or Firm* — Harness, Dickey & Pierce, P.L.C.

(57) ABSTRACT

Example embodiments may provide data storage devices using movement of magnetic domain walls including a first magnetic layer having at least two magnetic domains with determinable magnetization directions, and/or a soft second magnetic layer formed on a lower surface of the first magnetic layer. Magnetic domain walls may be moved even in curved regions of the first magnetic layer.

11 Claims, 7 Drawing Sheets

OTHER PUBLICATIONS

European Seach Report dated May 9, 2008 for corresponding European Application No. 07150110.0-2210.
Office Action dated May 6, 2010 issued in corresponding Chinese Application No. 200810002213.2 and English translation thereof.
Office Action dated Feb. 21, 2011 issued in Chinese Application No. 200810002213.2 and English translation thereof.
Office Action dated Jun. 17, 2011 issued in Chinese Application No. 200810002213.2 and English translation thereof.

* cited by examiner

MAGNETIC DOMAIN DATA STORAGE DEVICES AND METHODS OF MANUFACTURING THE SAME

PRIORITY STATEMENT

This application claims priority from Korean Patent Application No. 10-2007-0000309, filed on Jan. 2, 2007 in the Korean Intellectual Property Office (KIPO), the entire contents of which are incorporated herein by reference.

BACKGROUND

1. Field

Example embodiments may relate to data storage devices, for example, to data storage devices that can record, store, and/or erase data by moving magnetic domain walls in a magnetic material.

2. Description of the Related Art

Related art data storage devices with high speed and/or compact size have been developed. In general, a hard disk drive (HDD), which may be used as a data storage device, may include a reading/writing head and/or one or more platters in which data may be recorded. Related art HDDs may store large amounts of data of 100 gigabyte (GB) or more. Related art HDDs may have degraded performance due to wear and may malfunction as a result. Reliability of related art HDDs may be lowered as a result.

Related art data storage devices may use movement of magnetic domain walls in a magnetic material to increase reliability.

FIGS. 1A and 1B are schematic views illustrating the moving principle of magnetic domain walls in related art storage devices. As shown in FIG. 1A, a magnetic wire may include a first magnetic domain 11, a second magnetic domain 12, and/or a magnetic domain wall 13 as a boundary between the first and second magnetic domains 11 and 12.

In general, minute magnetic regions within a magnetic body are called magnetic domains. In a magnetic domain, the movement of electrons, that is, the direction of the magnetic moment, may be substantially uniform. Size and magnetization direction of the magnetic domains may be controlled by the shape and/or size of the magnetic material and/or external energy applied thereto. A magnetic domain wall may be a boundary of magnetic domains having different magnetizations. The magnetic domain wall may be moved by a magnetic field and/or a current applied to the magnetic material.

As shown in FIG. 1A, after forming a plurality of magnetic domains having a magnetic moment in a first magnetic layer having a determinable width and thickness, a magnetic domain wall may be moved by applying an appropriate magnetic field and/or a current from the outside.

As shown in FIG. 1B, if an external current is applied to the first magnetic layer in the direction away from the first magnetic domain 11 toward the second magnetic domain 12, the magnetic domain wall 13 may move toward the first magnetic domain 11. If an opposite current is applied, electrons may flow in the opposite direction, and the magnetic domain wall 13 may be moved in the same direction as the electrons. That is, the magnetic domain wall 13 may move in the opposite direction to the direction in which the external current is applied. If a current is applied away from the second magnetic domain 12 toward the first magnetic domain, the magnetic domain wall 13 may be moved away from the first magnetic domain 11 toward the second magnetic domain 12. Thus, the magnetic domain wall 13 may be moved by applying an external magnetic field or a current, thereby moving the magnetic domains 11 and 12.

The moving principle of a magnetic domain wall may be applied to data storage devices, for example, a HDD or a non-volatile RAM. A non-volatile memory device that may write and/or read data as '0' or '1' may be created using the principle that voltage in a linear magnetic material may be varied based on movement of a magnetic wall in the material having magnetic domains magnetized in particular directions and magnetic domain walls therebetween. Data may be written and/or read by changing the position of magnetic domain walls by applying a current to the linear magnetic material, and thus a higher integrated device having a simpler structure may be fabricated. By using the moving principle of the magnetic domain wall, a memory device with increased storage capacity over related art FRAMs, MRAMs, and/or PRAMs can be manufactured.

SUMMARY

Example embodiments may provide data storage devices using movement of magnetic domain walls and/or having a structure in which a pinning effect caused by an edge region of a first magnetic layer used as a data storage track may be reduced or prevented, and methods of manufacturing data storage devices.

Example embodiments may provide a data storage device including a first magnetic layer having at least two magnetic domains having magnetization directions and a soft second magnetic layer on a lower surface of the first magnetic layer.

The soft second magnetic layer may also be on a side of the first magnetic layer.

The soft second magnetic layer may also be on an upper surface of the first magnetic layer.

The first magnetic layer may be formed of a material having a magnetic anisotropy constant of about 105 to about 107 J/m3.

The first magnetic layer may be formed of, for example, CoPt, CoCrPt, FePt, SmCo, TbCoFe, and/or an alloy of any of these materials.

The first magnetic layer may be formed of a material having a magnetic anisotropic energy constant of about 10 to about $10^3$ J/m$^3$.

The soft second magnetic layer may be formed of, for example, NiFe, CoFe, CoFeNi, CoZrNb, CoTaZr, and/or an alloy of any of these materials.

The first magnetic layer may have a thickness of about 1 to about 100 nm.

The soft second magnetic layer may have a thickness of about 1 to about 100 nm.

Example methods of manufacturing data storage devices using movement of a magnetic domain wall may include coating a first polymer on a substrate, compressing the first polymer using a patterned master mold, and/or hardening the first polymer. The master mold may then be separated from the first polymer, and a soft second magnetic layer and a first magnetic layer may be coated on the polymer. A second polymer and compressing the second polymer may be coated using the patterned master mold, and a capping layer may be formed on the first magnetic layer and the second polymer. The capping layer and the upper portion of the first magnetic layer may then be removed by etching.

The first and second polymers may be formed of, for example, 2-hydroxy-2-methyl-1-phenyl-1-propanone, tetrahydrofurfuryl acrylate, 2-hydroxyethyl acrylate, polyether acrylate prepolymer, and/or acrylated epoxy prepolymer.

BRIEF DESCRIPTION OF THE DRAWINGS

The above and other features and/or advantages of example embodiments may become more apparent by describing them in detail with reference to the attached drawings in which.

DETAILED DESCRIPTION

Figure 1A:
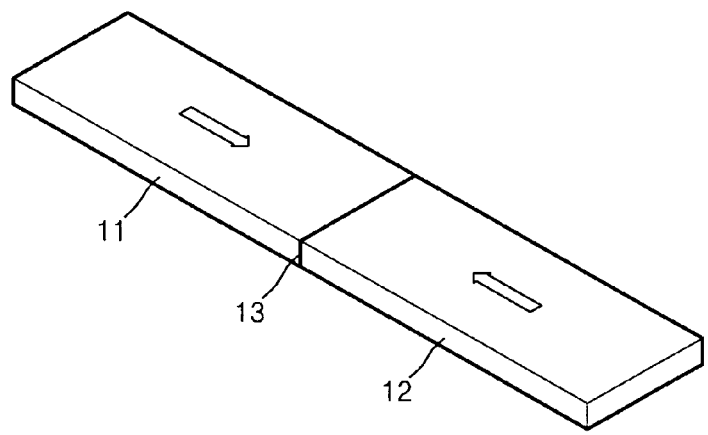
FIGS. 1A and 1B are schematic views illustrating the moving principle of magnetic domain walls in related art devices.
Figure 1B:
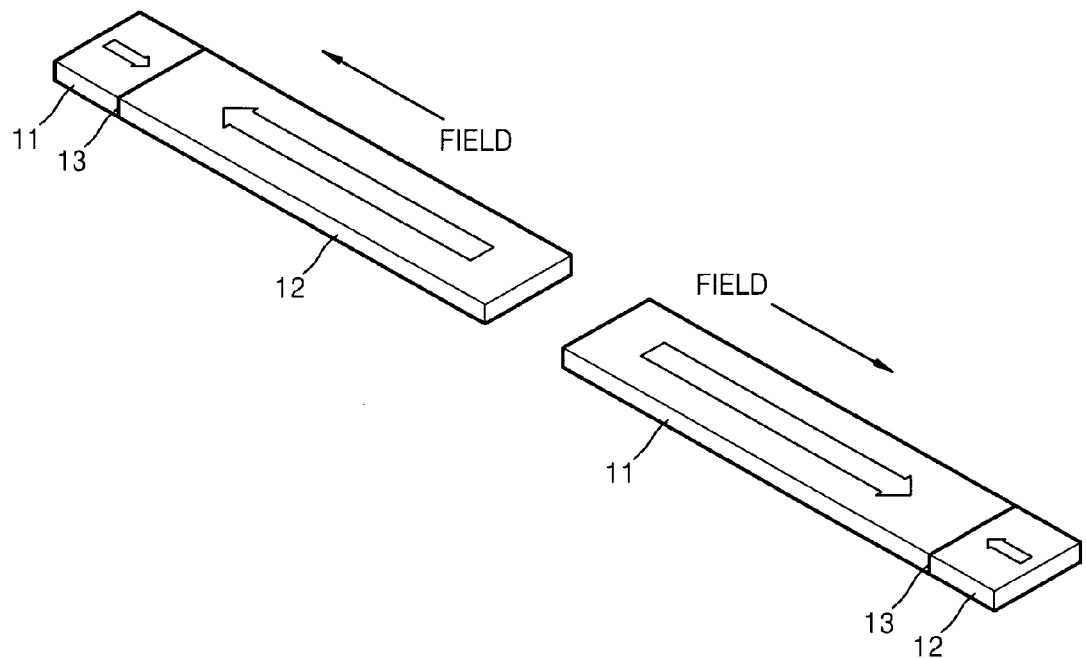

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1C:
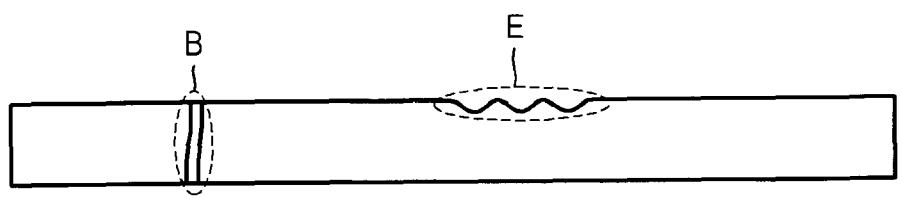
FIG. 1C is a schematic view illustrating a magnetic domain wall moving in a related art data storage device.

In a related art data storage device using the moving principle of a magnetic domain wall, a material having a higher magnetic anisotropy (higher-Ku) may be used as a first magnetic layer in the form of a wire and/or may be used as a data storage track. A first magnetic layer that may be formed using a related art deposition process may have curves on a surface thereof as illustrated in FIG. 1C. It has been discovered that, if the curves are dense, an edge region E may be formed. Thus, a pinning effect, which may cause a significant decrease in the moving speed of magnetic domain walls, may be generated in the edge region E. It has been discovered that if the moving speed of magnetic domain walls is decreased, recording and/or erasing speeds for data may be decreased.

Reference will now be made to example embodiments, which are illustrated in the accompanying drawings, wherein like reference numerals may refer to like components throughout.

Figure 2A:
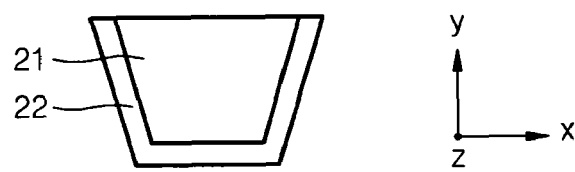
FIG. 2A is a cross-sectional view illustrating an example embodiment data storage device using movement of a magnetic domain.

FIG. 2A is a cross-sectional view illustrating an example embodiment data storage device using movement of a magnetic domain. As shown in FIG. 2A, the data storage device may include a first magnetic layer 21 for recording data having at least two magnetic domains and/or a soft second magnetic layer 22 on at least one surface of the first magnetic layer 21.

Figure 2B:
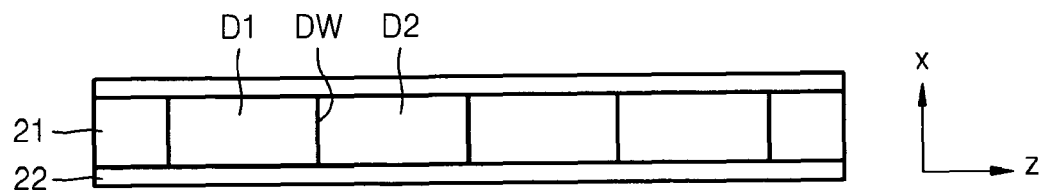
FIG. 2B is a plane view illustrating an example embodiment data storage device using movement of a magnetic domain.

FIG. 2B is a plane view illustrating the example embodiment data storage device of FIG. 2A. As shown in FIG. 2B, the soft second magnetic layer 22 may be on sides of the first magnetic layer 21, and a magnetic domain wall DW may be between the magnetic domains D1 and D2. In FIGS. 2A and 2B, the soft second magnetic layer 22 may be on three sides of the first magnetic layer 21; however, the soft second magnetic layer 22 may also be formed on one side of the first magnetic layer 21. For example, the second magnetic layer 22 may be on only a lower surface or may on the lower and upper surfaces of the first magnetic layer 21 or surround the first magnetic layer 21.

The first magnetic layer 21 may be formed of a material having a higher magnetic anisotropy constant, for example, in a range of about $10^5$ J/m$^3$ to about $10^7$ J/m$^3$, and made of a material having vertical magnetization that may improve magnetic recording density. For example, the first magnetic layer 21 may be formed of CoPt, CoCrPt, FePt, SmCo, TbCoFe, and/or another suitable material. The first magnetic layer 21 may have a thickness of about 1 to about 100 nm.

The soft second magnetic layer 22 may be formed of a material having a lower magnetic anisotropy constant than the first magnetic layer 21. The soft second magnetic layer 22 may be formed of a material having a magnetic anisotropy constant smaller than $10^3$ J/m$^3$, for example, about 10 to about $10^3$ J/m$^3$. For example, the soft second magnetic layer 22 may be formed of NiFe, CoFe, CoFeNi, CoZrNd, CoTaZr and/or another suitable material. The soft second magnetic layer 22 may have a thickness of about 1 to about 50 nm.

Figure 3:
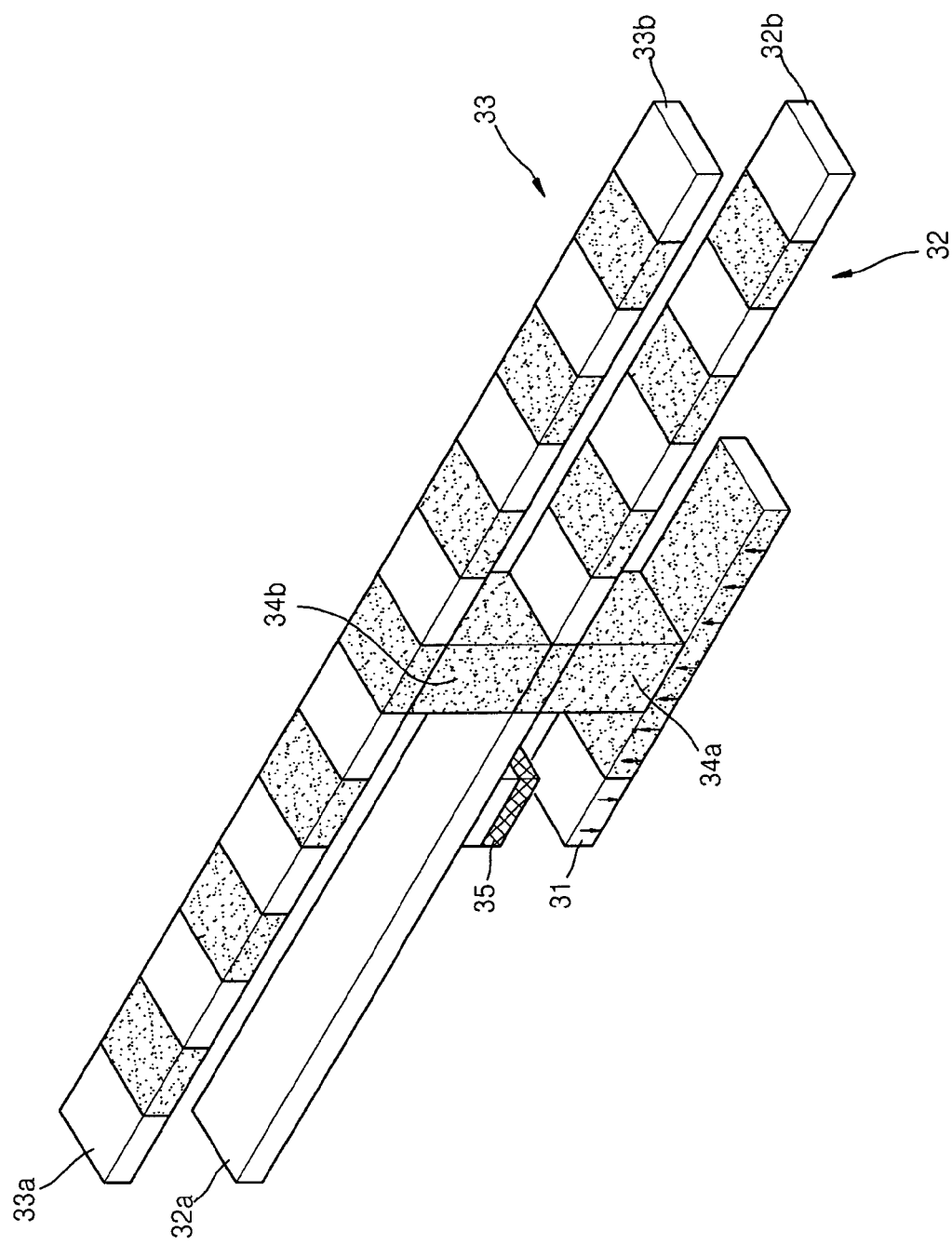
FIG. 3 is an isometric view of an example embodiment data storage device using movement of a magnetic domain wall.

FIG. 3 is a schematic view of an example embodiment data storage device including a data storage device using movement of a magnetic domain wall.

As shown in FIG. 3, the example embodiment data storage device may include a writing track 31, a storage and buffer track 32, and/or a storage track 33. A first connection layer 34a may be between the writing track 31 and the storage and buffer track 32, and a second connection layer 34b may be between the storage and buffer track 32 and the storage track 33.

The writing track 31 may include at least two magnetic domains having different magnetization directions for recording data. A buffer track 32a, which may be at a left side of the storage and buffer track 32, may access and/or read recorded data. In order to read data, the magnetization direction of the magnetic domains may be determined, and a magnetic resistance device 35 in the buffer track 32a may do so. The magnetic resistance device 35 may be, for example, a giant magnetoresistance (GMR) device or a tunneling magnetoresistance (TMR) device that may have a pinned layer of a ferromagnetic material, a nonmagnetic layer of a nonmagnetic material, such as Cu, Al$_2$O$_3$, or the like, and/or a free layer of a ferromagnetic material. A storage track 32b, which may be at right side of the storage and buffer track 32, may store data. The entire storage track 33 may be a storage track (33a, 33b). In FIG. 3, the buffer track 32a may be separate from the first magnetic layer (the writing track) 31; however, the writing track 31 may also be a buffer track if it has about the same length as or is longer than the storage and buffer track 32. In order to increase the recording density, further first magnetic layers may be formed on the storage track 33.

An example method of recording and/or reading data in example the embodiment data storage device illustrated in FIG. 3 will be described below.

First, a method of recording data will be described. If a data value in a magnetic domain having an upward magnetization direction corresponds to "1," a data value in a magnetic domain having a downward magnetization direction corresponds to "0." A plurality of magnetic domains having different magnetization directions may be formed in the magnetic layer 31 (the writing track), and magnetic domain walls may be between the magnetic domains. Data value "1" may be stored in the storage track 32b in the following manner. If a current is applied such that electrons flow from a right end to a left end of the writing track 31, the magnetic domain walls may move in the flow direction of electrons, and the magnetic domains having an upward magnetization direction may move toward the first connection layer 34a. A current may be applied such that electrons move from a right end of the writing track 31 toward the storage track 32b. Magnetic domains of the lower portion of the first connection layer 34a may move to the storage track 32b through the first connection layer 34a. As a result, magnetic domains having a data value of "1" may be stored in the storage track 32b.

Next, a method of reading data will be described. In order to read the magnetization direction of the magnetic domains, the magnetic domains may be moved to the buffer track 32a to which the magnetic resistance device 35 may be attached. A current may be applied through the buffer track 32a and the storage track 32b. For the electrons to move from the storage track 32b to the buffer track 32a, a current may be applied in the opposite direction, that is, from the buffer track 32a toward the storage track 32b. As the magnetic domains of the storage track 32b pass through the magnetic resistance device 35 in the buffer track 32a, the magnetic resistance device 35 may read the magnetization direction of the magnetic domains for each of the regions of the storage track 32b. Thus, the data value stored in the storage track 32b may be read.

Example methods of manufacturing data storage devices that use movement of magnetic domain walls will be described with reference to FIGS. 4A through 4I. Example embodiment data storage devices using movement of magnetic domain walls may be formed using a nano-imprinting method; however, other methods may also be used.

Figure 4A:
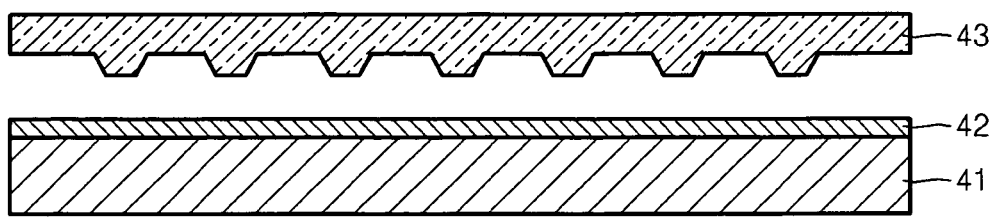
FIGS. 4A through 4I illustrate an example method of manufacturing a data storage device using movement of a magnetic domain wall.

As shown in FIG. 4A, a polymer 42 may be coated on a substrate 41. The substrate 41 may be a substrate used in related art semiconductor device manufacturing processes. The polymer 42 may be, for example, 2-hydroxy-2-methyl-1-phenyl-1-propanone, tetrahydrofurfuryl acrylate, 2-hydroxyethyl acrylate, polyether acrylate prepolymer, acrylated epoxy prepolymer, and/or another suitable polymer. A master mold 43 may be mounted on the polymer 42. The master mold 43 may have an uneven surface pattern.

Figure 4B:
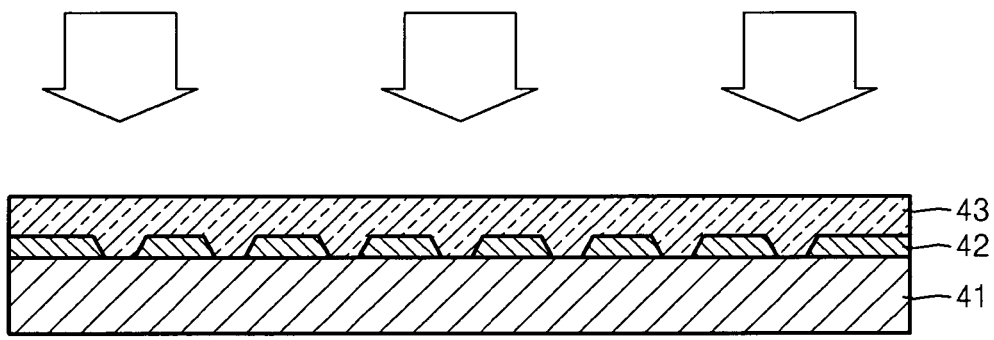
Figure 4C:
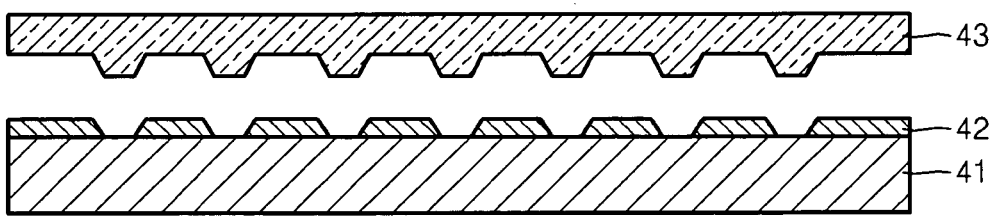

As shown in FIG. 4B, the master mold 43 may contact the polymer 42, and pressure may be applied to the master mold 43 to transfer the pattern of the master mold 43 to the polymer 42. The polymer 42 may thus have a pattern formed in the opposite direction to the pattern of the master mold 43. The polymer 42 may be hardened by applying heat to the polymer 42 and/or irradiating the polymer 42 with UV rays. As shown in FIG. 4C, after hardening the polymer 42, the master mold 43 may be separated from the polymer 42.

Figure 4D:
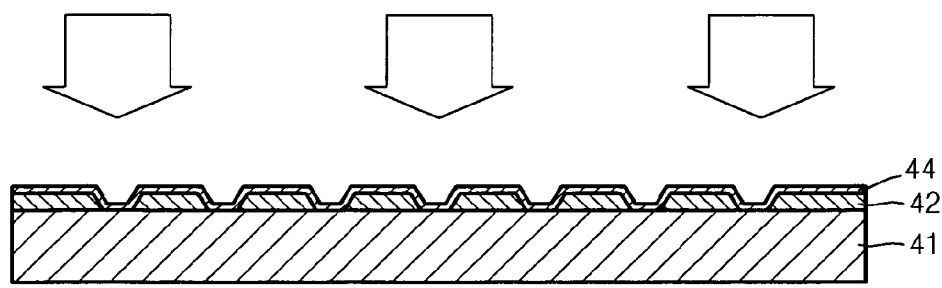

As shown in FIG. 4D, a soft second magnetic material, for example, NiFe, CoFe, CoFeNi, CoZrNb and/or CoTaZr, may be coated on the substrate 41 and the polymer 42 with a thickness of about 1 nm to about 50 nm using a sputtering method or the like to form a soft second magnetic layer 44.

Figure 4E:
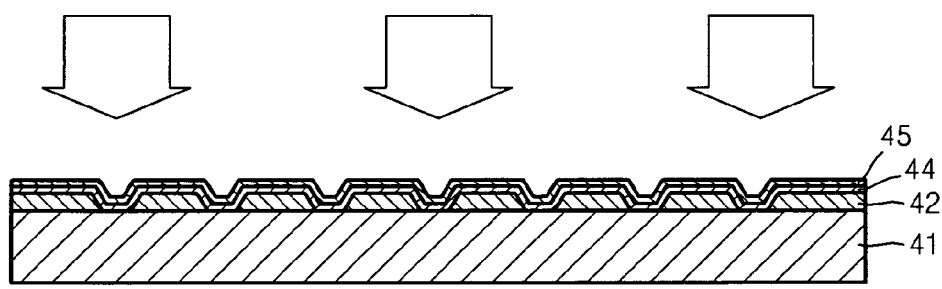

As shown in FIG. 4E, a material having a higher magnetic anisotropy constant (higher Ku), for example, CoPt, FePt CoCrPt, FePt, SmCo, TbCoFe, and/or another suitable material, may be coated on the soft second magnetic layer 44 to a thickness of about 1 nm to about 100 nm to form a first magnetic layer 45.

Figure 4F:
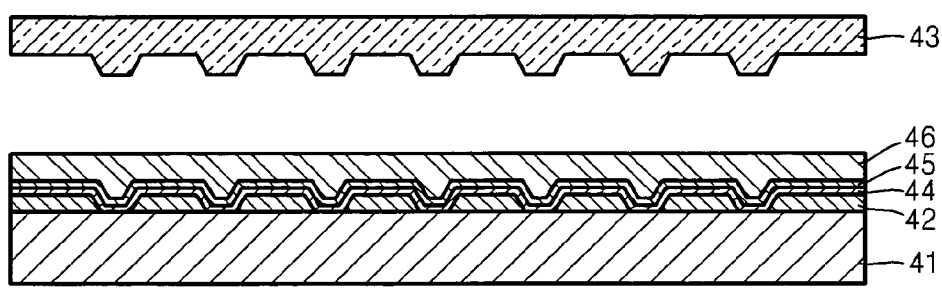
Figure 4G:
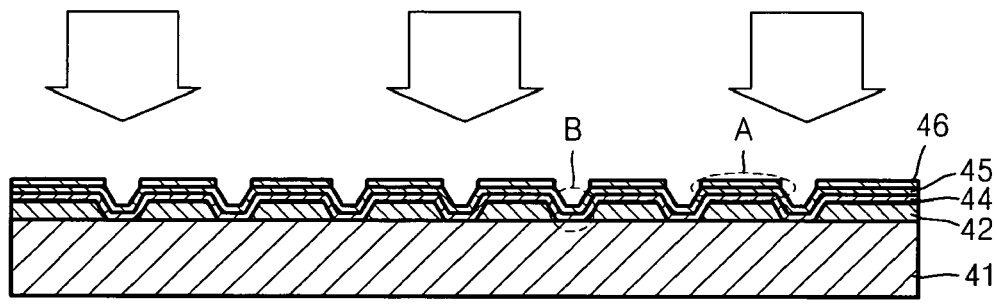

As shown in FIG. 4F, a polymer 46, which may be, for example, 2-hydroxy-2-methyl-1-phenyl-1-propanone, tetrahydrofurfuryl acrylate, 2-hydroxyethyl acrylate, polyether acrylate prepolymer, acrylated epoxy prepolymer, and/or another suitable polymer may be coated on the first magnetic layer 45, and the master mold 43 may be placed in contact with the polymer 46 and pressure may be applied to the polymer 46. As shown in FIG. 4G, the polymer 46 in an upper region A of the first magnetic layer 45 may remain after the mold 43 is removes, while the polymer 46 in a lower region B may be removed by any suitable method to expose a surface of the lower region B. The polymer 46 may be hardened using, for example, a nano-imprinting method.

Figure 4H:
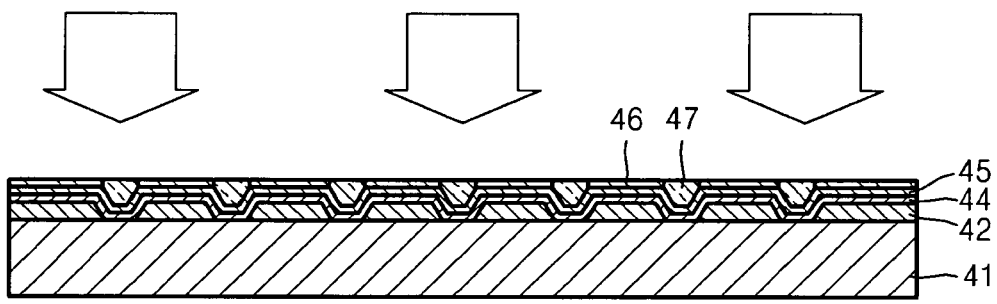
Figure 4I:
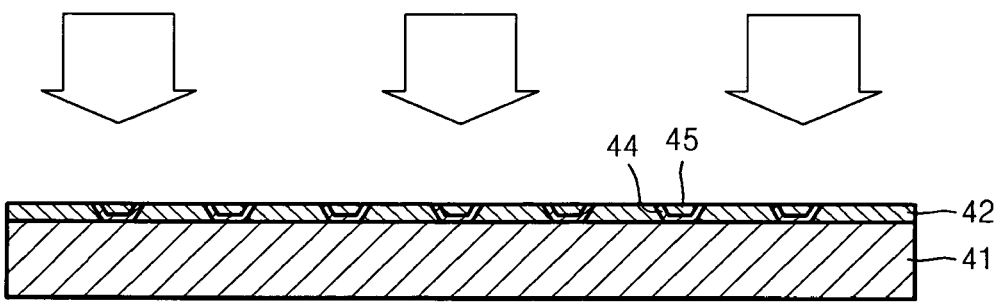

As shown in FIG. 4H, a nonmagnetic material such as Cu, Ag, Al, and/or another nonmagnetic material may be formed on the first magnetic layer 45 and, together with the polymer 46, may be electro-plated to form a capping layer 47. As shown in FIG. 4I, the first magnetic layer 45 of the lower region B may be exposed by an etching process. Sides and/or lower portions of the first magnetic layer 45 may be surrounded by the soft second magnetic layer 44. The nonmagnetic capping layer 47 may protect the first magnetic layer 45 of the lower region B during the etching process.

Figure 5:
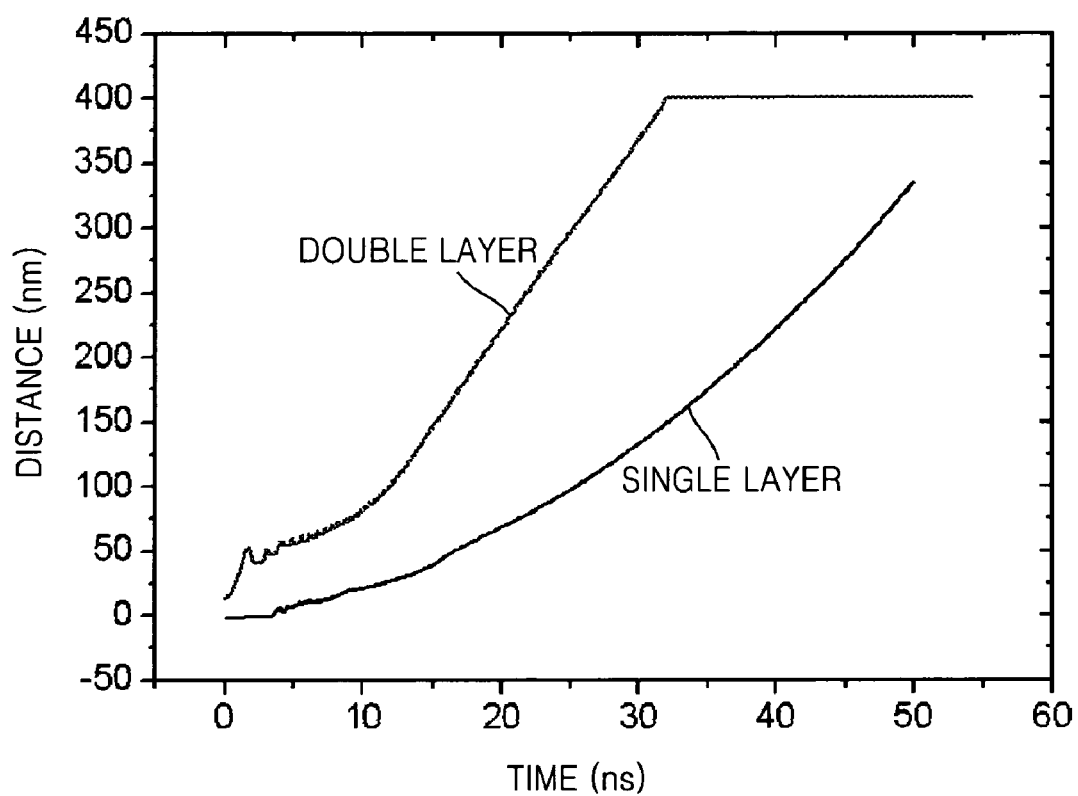
FIG. 5 is a graph comparing movement speed of magnetic domain walls of a related art data storage device having a FePt single layer structure against an example embodiment data storage device having a multi-layer structure including a FePt first magnetic layer and/or a CoZrNd soft second magnetic layer, wherein both data storage devices have a length of about 400 nm.

FIG. 5 is a graph comparing the movement speed of magnetic domain walls of a related art data storage device having a FePt single layer structure with an example embodiment data storage device having a multi-layer structure including a FePt first magnetic layer and a CoZrNd soft second magnetic layer, wherein both data storage devices have a length of about 400 nm.

As shown in FIG. 5, the distance the magnetic domain walls move per unit time (ns) in the data storage device (double layers) in example embodiments may be greater than that in the related art data storage device formed of a single FePt layer (single layer).

Example embodiment data storage devices using movement of magnetic domain walls may have the following advantages.

Example embodiments may prevent or reduce decreased movement speed of magnetic domain walls passing curved regions, which may be present in related art devices.

Unlike a HDD, when driving example embodiment data storage devices having a first magnetic layer and a second magnetic layer, data may be stored and/or reproduced without mechanically moving or contacting any elements of the data storage device. Thus a compact-sized, high density data storage device capable of storing data in the range of terabits (Tbit/in$^2$) may be provided.

Because example embodiment data storage devices may have a simplified design, they may be suitable for mass production.

While example embodiments have been particularly shown and described with reference to the attached drawings, the exemplary embodiments should be considered in a descriptive sense only and not for purposes of limitation. For example, it will be understood by those skilled in the art that example embodiment data storage devices using movement of magnetic domain walls may include a soft second magnetic layer formed on a side or on both sides of a first magnetic layer, or external sides of a first magnetic layer may be surrounded by a soft second magnetic layer. Therefore, the scope of the disclosure is defined not by the detailed description but by the appended claims.

What is claimed is:

1. A data storage device using magnetic domain wall motion, the data storage device comprising:
   a first magnetic layer including a plurality of magnetic domains, which are movable in the first magnetic layer by at least one of a current and a magnetic field applied to the plurality of magnetic domains, each of the magnetic domains having a magnetization direction; and
   a second magnetic layer on a first surface of the first magnetic layer, the second magnetic layer being formed of a soft magnetic material and being in direct contact with the magnetic domains; wherein
   the first magnetic layer is a contiguous magnetic layer including a plurality of adjacent magnetic domains.

2. The data storage device of claim 1, wherein the first surface of the first magnetic layer is a lower surface of the first magnetic layer, and the second magnetic layer is additionally on at least one side of the first magnetic layer.

3. The data storage device of claim 1, wherein the first surface of the first magnetic layer is a lower surface of the first magnetic layer, and the second magnetic layer is additionally on an upper surface of the first magnetic layer.

4. The data storage device of claim 1, wherein the first magnetic layer is formed of a material having a magnetic anisotropy constant of about $10^5$ J/m$^3$ to about $10^7$ J/m$^3$.

5. The data storage device of claim 1, wherein the first magnetic layer is formed of at least one of CoPt, CoCrPt, FePt, SmCo, TbCoFe, and an alloy of these materials.

6. The data storage device of claim 1, wherein the second magnetic layer is formed of a material having a magnetic anisotropic energy constant of about 10 J/m$^3$ to about $10^3$ J/m$^3$.

7. The data storage device of claim 1, wherein the second magnetic layer is formed of at least one of NiFe, CoFe, CoFeNi, CoZrNb, CoTaZr, and an alloy of these materials.

8. The data storage device of claim 1, wherein the first magnetic layer has a thickness of about 1 nm to about 100 nm.

9. The data storage device of claim 1, wherein the second magnetic layer has a thickness of about 1 nm to about 100 nm.

10. The data storage device of claim 1, further comprising:
    a writing element configured to write data to the first magnetic layer.

11. The data storage device of claim 1, further comprising:
    a reading element configured to read data from the first magnetic layer.

* * * * *